United States Patent
He et al.

(10) Patent No.: US 8,125,020 B2
(45) Date of Patent: Feb. 28, 2012

(54) NON-VOLATILE MEMORY DEVICES WITH CHARGE STORAGE REGIONS

(75) Inventors: Yue-Song He, San Jose, CA (US); Len Mei, San Jose, CA (US)

(73) Assignee: Promos Technologies Pte. Ltd, Districentre (SG)

( * ) Notice: Subject to any disclaimer, the term of this patent is extended or adjusted under 35 U.S.C. 154(b) by 345 days.

(21) Appl. No.: 11/872,477

(22) Filed: Oct. 15, 2007

(65) Prior Publication Data

US 2009/0096013 A1    Apr. 16, 2009

(51) Int. Cl.
*H01L 29/792* (2006.01)
*H01L 29/788* (2006.01)

(52) U.S. Cl. ............. 257/324; 257/314; 257/E29.305; 257/E29.309

(58) Field of Classification Search .......... 257/324, 257/314–316, E29.305, E29.309
See application file for complete search history.

(56) References Cited

U.S. PATENT DOCUMENTS

| | | | |
|---|---|---|---|
| 5,467,308 A * | 11/1995 | Chang et al. | 365/185.01 |
| 6,177,318 B1 | 1/2001 | Ogura et al. | |
| 6,949,788 B2 | 9/2005 | Fujiwara et al. | |
| 7,067,373 B2 | 6/2006 | Shukuri | |
| 2002/0100926 A1* | 8/2002 | Kim et al. | 257/296 |
| 2004/0185616 A1* | 9/2004 | Ding | 438/257 |
| 2007/0145455 A1 | 6/2007 | Yasui et al. | |

* cited by examiner

*Primary Examiner* — Anh Phung
*Assistant Examiner* — Allison P Bernstein
(74) *Attorney, Agent, or Firm* — Haynes and Boone, LLP (57) ABSTRACT

A memory device includes a cell stack and a select gate formed adjacent to the cell stack. The cell stack includes a tunneling dielectric layer, a charge storage layer, a blocking dielectric layer, and a control gate. Applying a positive bias to the control gate, the select gate and the source of the device injects negative charges from a channel region of a substrate by hot electron injection through the tunneling dielectric layer at a location near a gap between the select gate and the control gate into the charge storage layer to store negative charges in the charge storage layer. Applying a negative bias to the control gate directly tunnels positive charges from the channel region of the substrate through the tunneling dielectric layer and into the charge storage layer to store positive charges in the charge storage layer.

20 Claims, 8 Drawing Sheets

NON-VOLATILE MEMORY DEVICES WITH CHARGE STORAGE REGIONS

TECHNICAL FIELD

The present invention relates to memory devices and, in particular, to non-volatile memory devices with charge storage regions.

BACKGROUND

Some conventional embedded flash memory devices utilize a split gate floating gate device with source side junction Fowler-Nordheim (FN) tunnel erase to provide page erase functionality. These memory cells have limited scalability. For example, a conventional 0.18 um embedded flash memory cell cannot be scaled due to the source erase option. In general, the source junction needs to be graded enough to improve the post cycling induced read current degradation. Since the graded source junction takes a large portion of the channel region area to prevent punch-through of the device, the cell cannot be scaled accordingly. Moreover, the cell size is not small enough to be competitive in many flash memory devices, and the application is limited.

SUMMARY

The present disclosure overcomes the deficiencies of conventional memory devices by providing a scalable memory device having a smaller cell size of at least less than 180 nm. In various embodiments, cell size refers to the area of the memory cell device, and the 0.18 um comprises the device channel length of the channel region. In one embodiment, the scalable memory cell of the present disclosure may be sized to approximately 90 nm. The present disclosure describes a split-gate silicon-rich-nitride based non-volatile memory device, such as a SG-SOROS (split-gate silicon-oxide-nitride rich-oxide-silicon) memory cell for embedded flash memory applications.

In various implementations, the SG-SOROS cell provides low operating voltages, fast read and writes times, and smaller cell size. The present disclosure provides for a program operation for fast write speed, such as, for example, source side hot carrier injection (i.e., hot electron injection), which allows for fast write speed. The present disclosure provides for an erase operation, such as, for example, channel direct tunneling, which allows for smaller cell size and lower operation voltage.

Embodiments of the present disclosure provide a non-volatile memory device having a cell stack and a select gate formed adjacent to a sidewall of the cell stack. The cell stack includes a tunneling dielectric layer formed on a channel region of a substrate, a charge storage layer formed on the tunneling dielectric layer, a blocking dielectric layer formed on the charge storage layer, and a control gate formed on the blocking dielectric layer. In one aspect, when a positive bias is applied to the control gate, the select gate and the source of the device, negative charges are injected from the channel region of the substrate through the tunneling dielectric layer and into the charge storage layer to thereby store the negative charges in the charge storage layer. In another aspect, when a negative bias is applied to the control gate, positive charges are directly tunneled from the channel region of the substrate through the tunneling dielectric layer and into the charge storage layer to thereby store the positive charges in the charge storage layer.

Embodiments of the present disclosure provide a method for manufacturing a non-volatile memory device. The method includes forming a tunneling dielectric layer on a channel region of a substrate, forming a charge storage layer on the tunneling dielectric layer, forming a blocking dielectric layer on the charge storage layer, forming a control gate on the blocking dielectric layer, and forming a select gate adjacent to the charge storage layer. In one aspect, applying a positive bias to the control gate and the select gate stores negative charges in the charge storage layer, and applying a negative bias to the control gate stores positive charges in the charge storage layer.

The scope of the disclosure is defined by the claims, which are incorporated into this section by reference. A more complete understanding of embodiments will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments and their advantages are best understood by referring to the detailed description that follows. It should be appreciated that like reference numerals are used to identify like elements illustrated in one or more of the figures.

DETAILED DESCRIPTION

The present disclosure describes a split-gate silicon-rich-nitride based non-volatile memory device, such as a SG-SOROS memory cell for embedded flash memory applications. In one aspect, the SG-SOROS memory cell may be referred to as a Split Gate SONOS memory cell. In various implementations, the SG-SOROS cell provides low operating voltages, fast read and writes times, and smaller cell size.

The memory cell of the present disclosure allows for lower program and erase voltages. With a channel erase approach, a smaller memory cell size is achievable, and due to faster access times, a high voltage peripheral P-channel device with breakdown voltage up to 18V is not needed. The memory cell of the present disclosure is compatible with existing CMOS (complementary metal oxide semiconductor) processes thereby allowing for lower wafer costs, lower test costs, and relatively good reliability.

Embodiments of the present disclosure provide for a program operation for fast write speed, such as, for example, source side hot carrier injection (i.e., hot electron injection), which allows for fast write speed. Embodiments of the present disclosure provide for an erase operation, such as, for example, channel direct tunneling, which allows for smaller cell size and lower operation voltage Embodiments of the present disclosure provide a scalable memory cell having a cell channel length of at least less than 180 nm. For example, in one embodiment, the cell channel length of the scalable memory cell may be sized to approximately 90 nm. These and other aspects of the present disclosure will be discussed in greater detail herein.

FIGS. 1A-1L show one embodiment of a process for forming a memory cell of the present disclosure. In one embodiment, the memory cell comprises a non-volatile SG-SOROS memory cell for flash memory applications having a silicon rich nitride region that functions as a charge storage region.

Figure 1A:
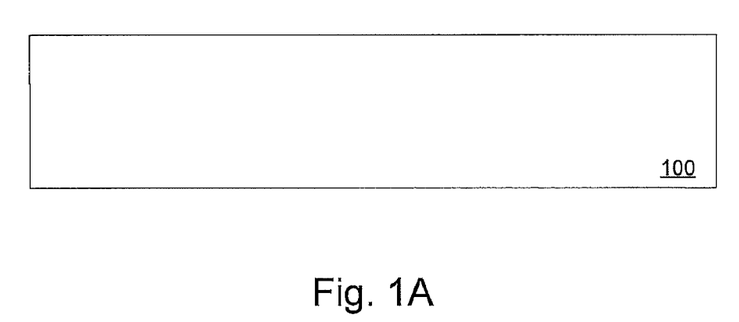
FIGS. 1A-1L show a process for forming a non-volatile memory device in accordance with one embodiment of the present disclosure.

FIG. 1A shows one embodiment of a substrate 100 comprising a semiconductor material. In one implementation, substrate 100 comprises a P-type mono-crystalline silicon (Si) substrate.

Figure 1B:
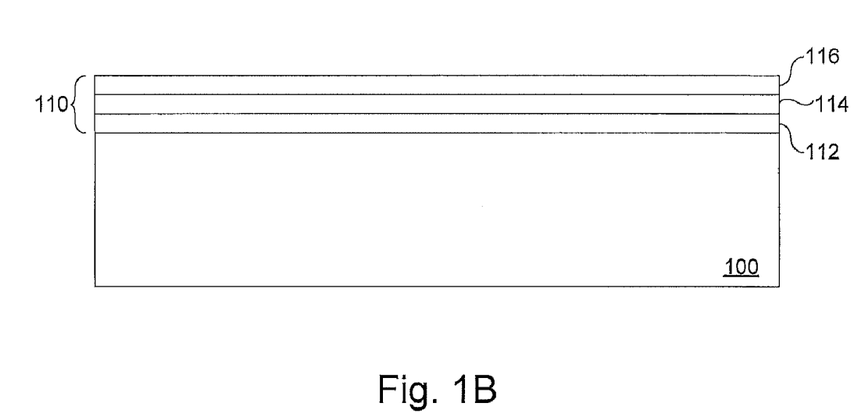

FIG. 1B shows one embodiment of forming an ONO (oxide-nitride-oxide) layer 110 on substrate 100. In one implementation, ONO layer 110 includes a first oxide layer 112, a nitride layer 114 and a second oxide layer 116.

In one embodiment, first oxide layer 112 is formed on substrate 100 and comprises a tunneling dielectric region of silicon-dioxide ($SiO_2$). In one implementation, first oxide layer 112 may be formed with a thickness of approximately 15-25 A (Angstrom). In another implementation, first oxide layer 112 may be formed with a thickness of approximately 21 A.

In one embodiment, nitride layer 114 is formed on first oxide layer 112 and comprises a charge storage region of a silicon rich nitride material, such as, for example, silicon-nitride ($Si_3N_4$). In one implementation, nitride layer 114 may be form with a thickness of approximately 50-70 A. In another implementation, nitride layer 114 may be form with a thickness of approximately 60 A.

In one embodiment, second oxide layer 116 is formed on nitride layer 114 and comprises a blocking dielectric region of silicon-dioxide ($SiO_2$). In one implementation, second oxide layer 116 may be formed with a thickness of approximately 70-90 A. In another implementation, second oxide layer 116 may be formed with a thickness of approximately 80 A.

Figure 1C:
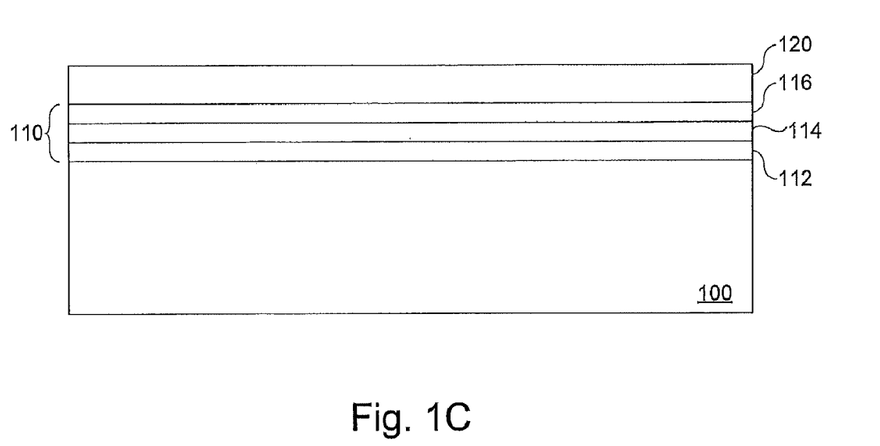

FIG. 1C shows one embodiment of forming a first gate layer 120 on second oxide layer 116 of ONO layer 110. In one implementation, first gate layer 120 comprises a gate of poly-silicon (poly-Si). In various other implementations, first gate layer 120 may comprise a gate of one or more of poly-silicon (poly-Si), doped poly-Si, phosphorous (P), metal (e.g., tungsten (W) or tantalum (Ta)) or some other conductive material. In one implementation, first gate layer 120 may be formed with a thickness of approximately 2300-2700 A. In another implementation, first gate layer 120 may be formed with a thickness of approximately 2500 A.

Figure 1D:
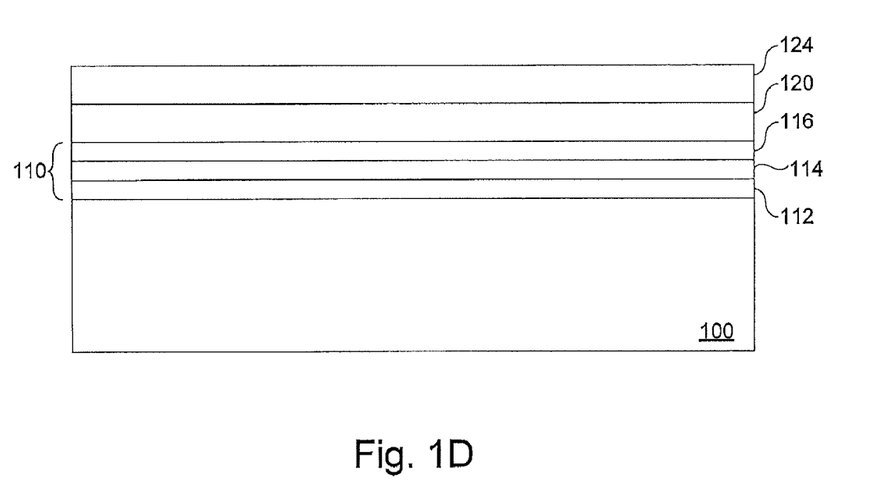

FIG. 1D shows one embodiment of forming a second gate layer 124 on first gate layer 120. In various implementations, second gate layer 124 may be referred to as an electrode layer comprising tungsten-silicide ($WSi_2$) or poly-silicon (poly-Si).

In one embodiment, tunneling dielectric region (i.e., first oxide layer 112) is formed between charge storage region (i.e., nitride layer 114) and substrate 100 as a tunnel dielectric and also to reduce charge leakage from the charge storage region (i.e., 114) to substrate 100. Blocking dielectric region (i.e., second oxide layer 116) is formed between charge storage region (i.e., 114) and gate (i.e., gate layer 120) to reduce charge leakage from the charge storage region (i.e., 114) to gate (i.e., 120). In various implementations, first and second gate layers 120, 124 form a split gate, which may be referred to as a control gate.

Figure 1E:
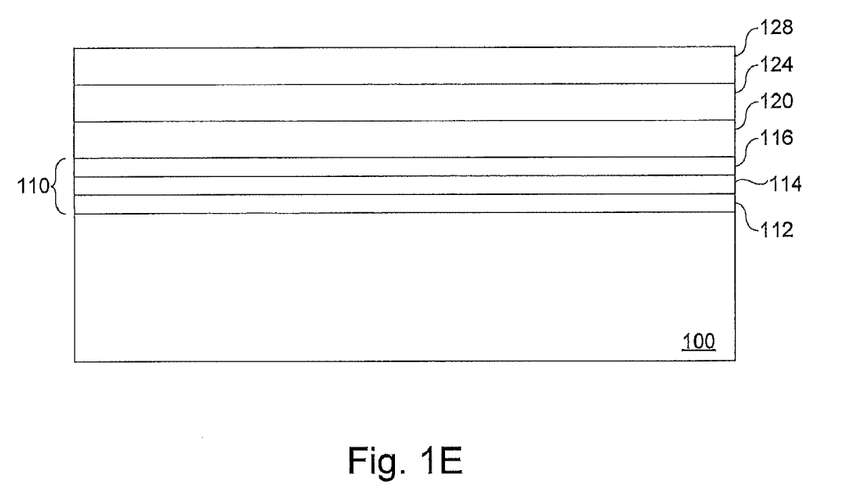

FIG. 1E shows one embodiment of forming a protection layer 128 on electrode layer 124. In one implementation, protection layer 128 comprises a region of silicon-nitride (SiN). It should be appreciated that protection layer 128 may be referred to as a hard mask without departing from the scope of the present disclosure.

Figure 1F:
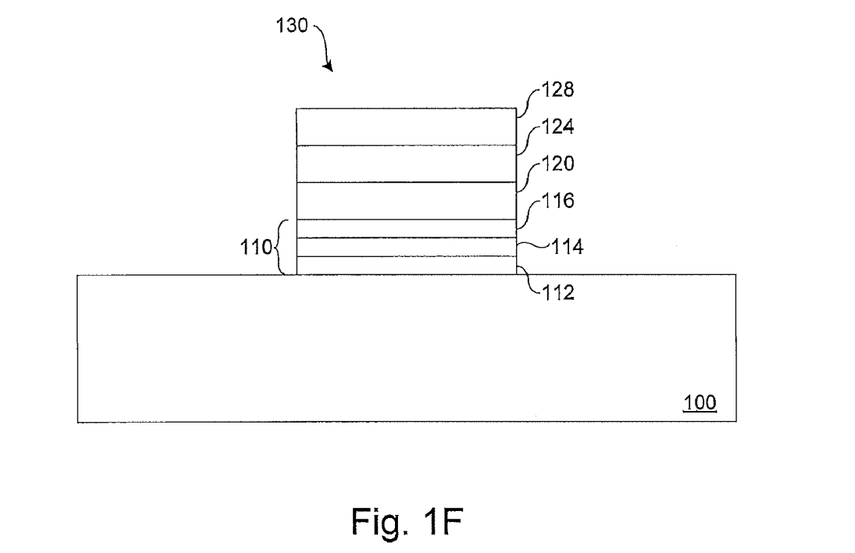

FIG. 1F shows one embodiment of etching a portion of layers 110 (i.e., layers 112, 114, 116), 120, 124, 128 to form a cell stack 130 on substrate 100. It should be appreciated that various types of generally known etching techniques may be used without departing from the scope of the present disclosure.

Figure 1G:
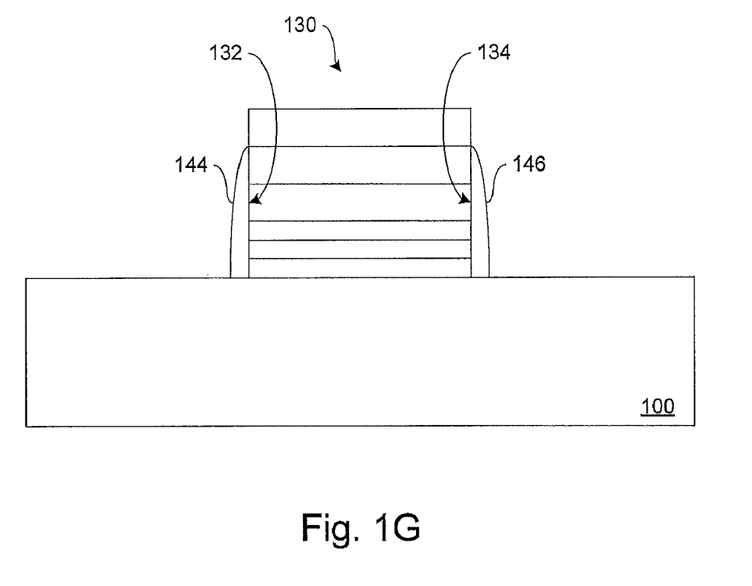

FIG. 1G shows one embodiment of forming oxide sidewall portions 144, 146 on substrate 100 and sidewalls 132, 134 of cell stack 130. As shown in FIG. 1G, cell stack 130 comprises first and second sidewalls 132, 134 that extend vertically from substrate 100. As further shown in FIG. 1G, first and second sidewall portions 144, 146 are formed on first and second sidewalls 132, 134 of cell stack 130, respectively, so as to extend vertically adjacent thereto. In one implementation, each sidewall portion 144, 146 comprises a layer of oxide (e.g., silicon dioxide: $SiO_2$) that insulates and/or isolates end portions of layers 112, 114, 116, 120, 124 from other layers including substrate 100 to reduce charge leakage.

Figure 1H:
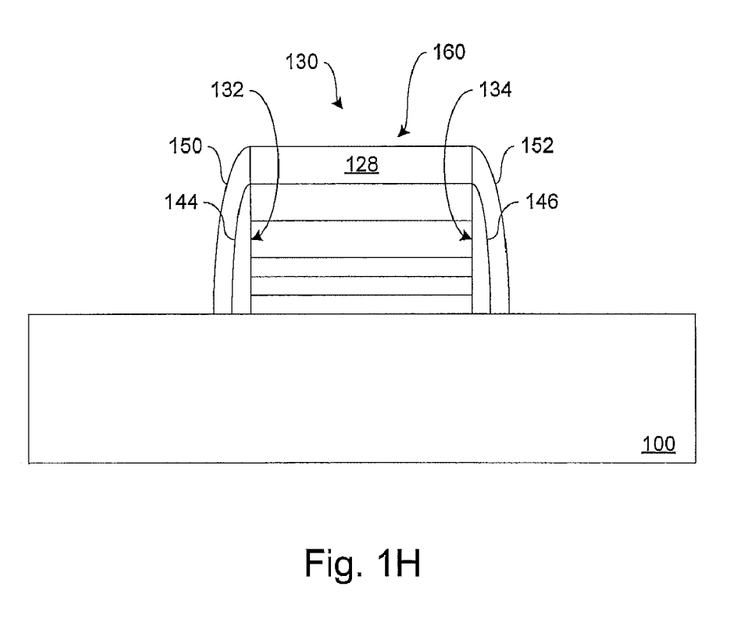

FIG. 1H shows one embodiment of forming spacers 150, 152 on substrate 100 and on sidewall portions 144, 146. As shown in FIG. 1H, first and second spacers 150, 152 are formed adjacent to first and second sidewalls 132, 134 of cell stack 130, respectively, with sidewall portions 144, 146 interposed therebetween. Spacers 150, 152 comprise silicon-nitride (SiN), which is similar to protection layer 128. As further shown in FIG. 1H, an upper portion of each spacer 150, 152 contacts end portions of protection layer 128, respectively, to form a cap 160 over cell stack 130. In one implementation, cap 160 comprises a series combination of SiN components including first spacer 150, protection layer 128 and second spacer 152.

Figure 1I:
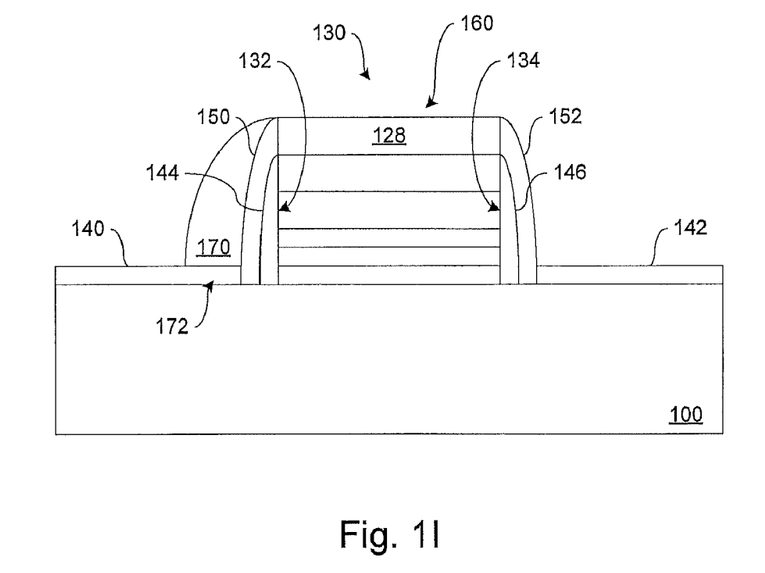

FIG. 1I shows one embodiment of forming oxide layers 140, 142 on substrate 100 and adjacent to sidewall portions 144, 146, respectively. As further shown in FIG. 1I, a select gate 170 is formed on oxide layer 140 and adjacent to first spacer 150. In one implementation, oxide layers 140, 142 comprise silicon-dioxide ($SiO_2$) and select gate 170 comprises poly-silicon (poly-Si). As further shown in FIG. 1I, select gate 170 may be formed adjacent to first sidewall 132 of cell stack 130 with first spacer 150 and first sidewall portion 144 interposed therebetween. In various implementations, select gate 170 may be referred to as a word line.

As shown in FIG. 1I, a portion of oxide layer 140 is interposed between select gate 170 and substrate 100. Hence, in one aspect, at least a portion of oxide layer 140 may be referred to as a select gate oxide 172. In one implementation, select gate oxide 172 may be formed with a thickness of approximately 80-200 A. In another implementation, select gate oxide 172 may be formed with a thickness of approximately 100-150 A. In still another implementation, select gate oxide 172 may be formed with a thickness of approximately 120 A.

Figure 1J:
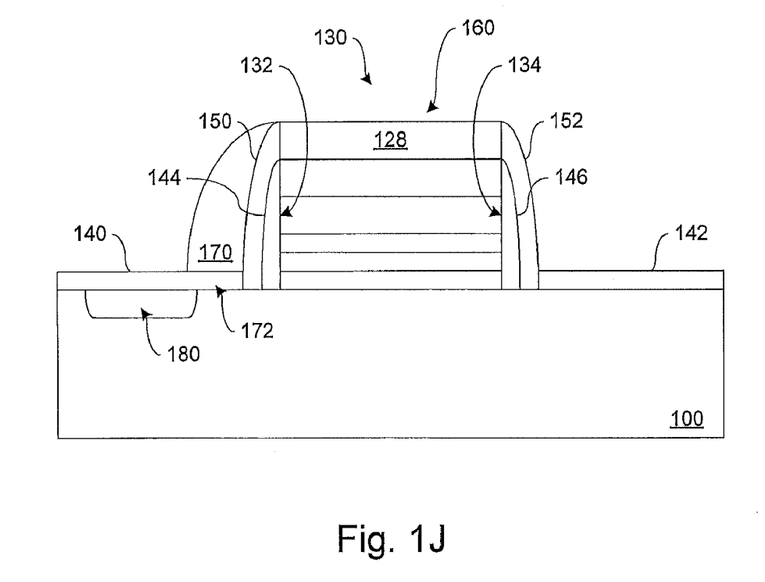

FIG. 1J shows one embodiment of forming a drain region 180 in substrate 100. In one implementation, drain region 180 is formed by implanting (n+) dopant in the area of drain region 180 of substrate 100. In one implementation, drain region 180 is formed in substrate 100 below oxide layer 140 and adjacent to select gate 170.

Figure 1K:
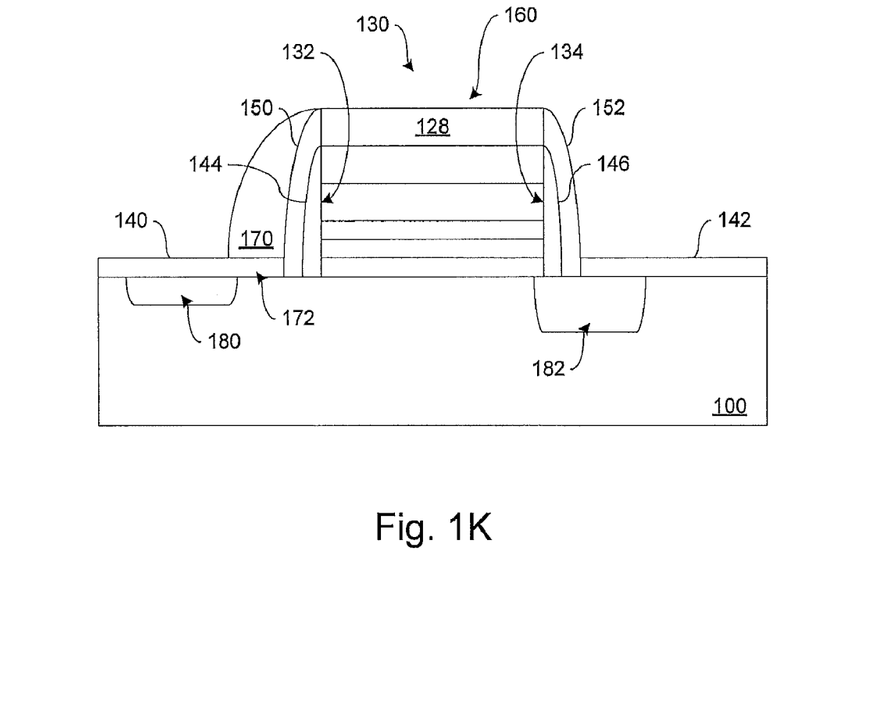

FIG. 1K shows one embodiment of forming a source region 182 in substrate 100. In one implementation, source region 182 is formed by implanting (n+) dopant in the area of source region 182 of substrate 100. In one implementation, source region 182 is formed in substrate 100 below oxide layer 142.

Figure 1L:
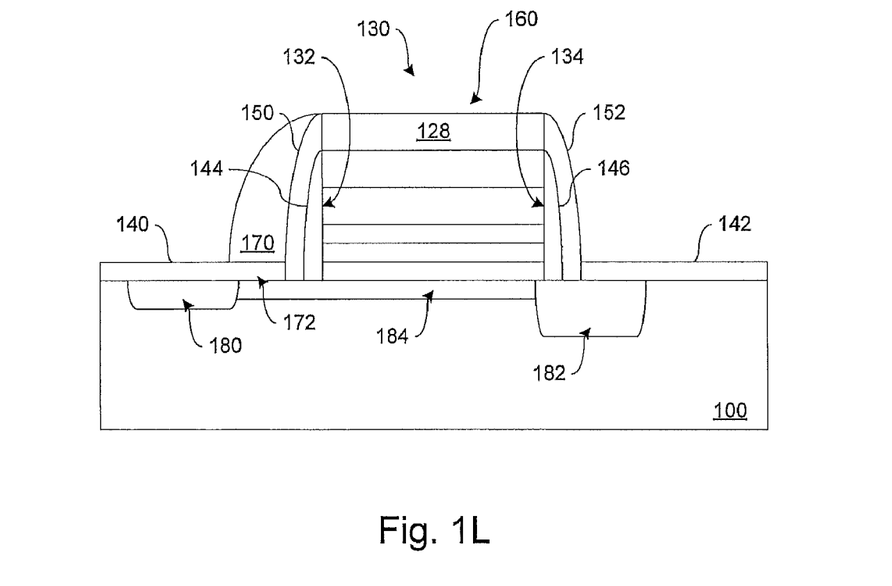

FIG. 1L shows one embodiment of forming a channel region 184 in substrate 100. In one implementation, channel region 184 comprises a P-type channel region that is formed adjacent first oxide layer 112 of cell stack 130 and interposed between drain region 180 and source region 182. In other words, as shown in FIG. 1L, P-type channel region 184 is formed in substrate 100 between N-type source and drain regions 180, 182. Charge storage region (i.e., nitride layer 114) overlies channel region 184.

It should be appreciated that, in one embodiment, channel region 184 may comprise a portion of a P-type well formed in substrate 100 and may be isolated from other portions of substrate 100 by PN junctions and/or dielectric regions. Tunnel dielectric region (i.e., first oxide layer 112) is formed on channel region 184 so as to overlap or overlie at least a portion of drain and source regions 180, 182. It should be appreciated that, in various embodiments, channel region 184 may be formed at any appropriate time during the process as discussed in reference to FIGS. 1A-1L.

The fabrication process discussed in reference to FIGS. 1A-1L should not limit the present disclosure. In various implementations, any one or more of layers 112, 114, 116, 120, 124, 128, 140, 142, 150, 152, 170 may be patterned using a separate mask, and the P and N conductivity types may be reversed. The present disclosure should not be limited to any particular cell geometry. In various implementations, all or part of channel region 184 may be vertical, and all or part of charge storage region (i.e., nitride layer 114) may be formed in a trench in substrate 100. The memory cell stack 130 may comprise a multi-level cell with the charge storage region (i.e., nitride layer 114) divided into sub-regions each of which may store one bit of information. The present disclosure should not be limited to particular materials except as defined by the claims.

Figure 2:
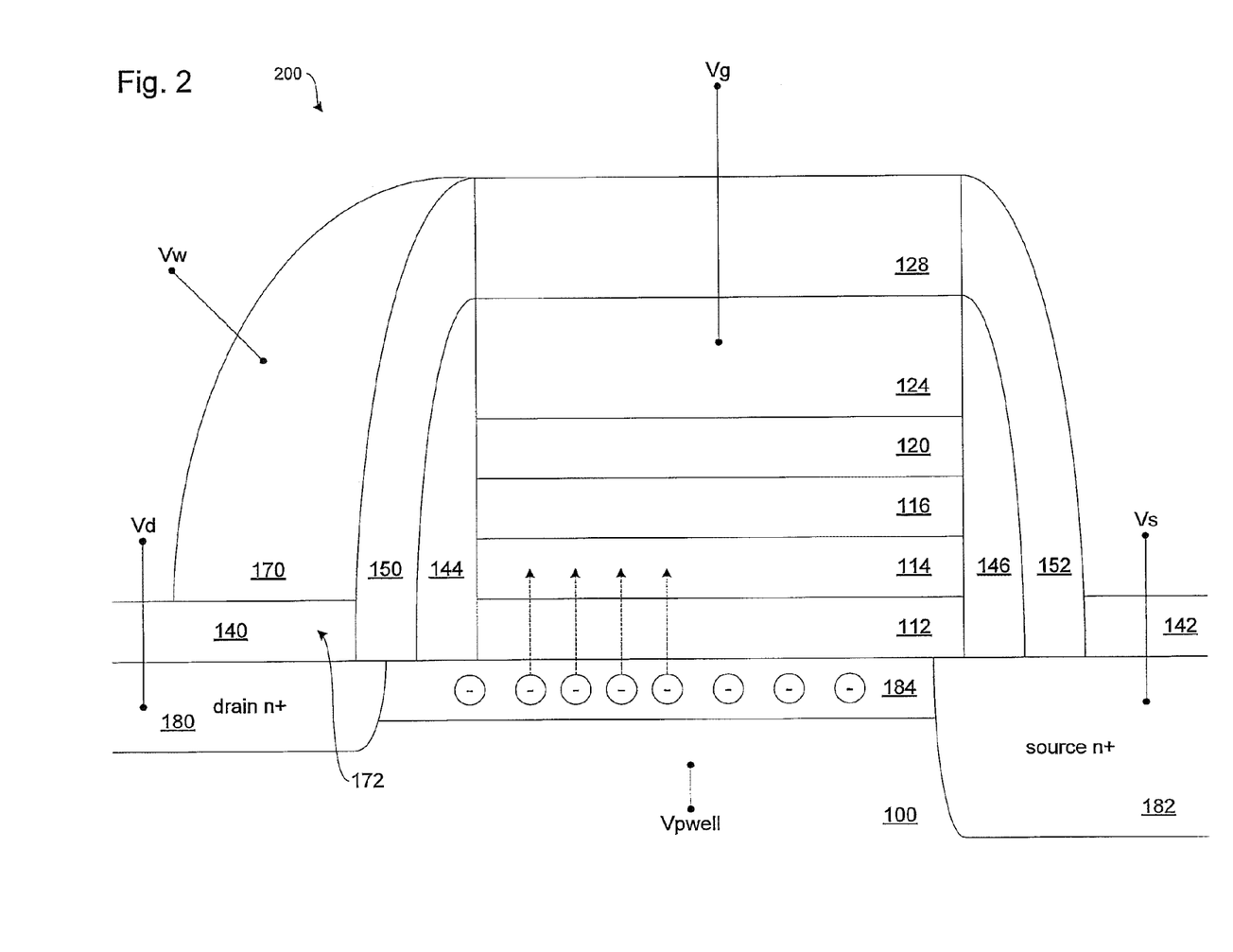
FIG. 2 shows one embodiment of a program operation for the non-volatile memory device formed from the process of FIGS. 1A-1L.

FIG. 2 shows one embodiment of a program operation for memory cell 200 formed from the process of FIGS. 1A-1L. In one aspect, the program operation shown in FIG. 2 may be referred to as channel hot electron injection of electrons from channel region 184 to nitride layer 114. As described herein, a positive bias is applied to gate region 124 and source region 182 to inject electrons into nitride layer 114 at the gap between select gate 170 and gate region 124. In one embodiment, the nitride layer 114 functions as a charge storage layer for storing or trapping negative charges.

In one implementation, when voltages are applied to gate region 124 (e.g., Vg of approx. +5-9V and, in one instance, approx. +8.5V), source region 182 (e.g., Vs of approx. +4.5-6.5V and, in one instance, approx. +5V), and drain region 180 (e.g., Vd of approx. 0V) relative to channel region 184, some electrons in channel region 184 gain enough energy to tunnel through dielectric region (i.e., first oxide layer 114) into the charge storage region (i.e., nitride layer 114). The electrons become trapped in the charge storage region thereby increasing the threshold voltage of the memory cell 200, which may be referred to as a program state or "0" state. In one embodiment, the threshold voltage may be sensed by sensing the current between source and drain regions 182, 180 when suitable voltages are applied to gate region 124, substrate 100, and source/drain regions 182, 180. In another embodiment, when a negative voltage is applied to gate region 124 relative to channel region 184 or source/drain regions 182, 180, the threshold voltage of the memory cell 200 drops, which may be referred to as an erase state or "1" state.

The following table describes one embodiment of the approximate node voltages for programming memory cell 200 of FIG. 2:

| Program Voltage Table | | |
|---|---|---|
| | Range | Approx. |
| Vg | +5 to +9 V | +8.5 V |
| Vd | ~0 V | 0 V |
| Vs | +4.5 to +6.5 V | +5.0 V |
| Vw | +0.8 to +2 V | +1.2 V |
| Vpwell | ~0 V | 0 V |

Figure 3:
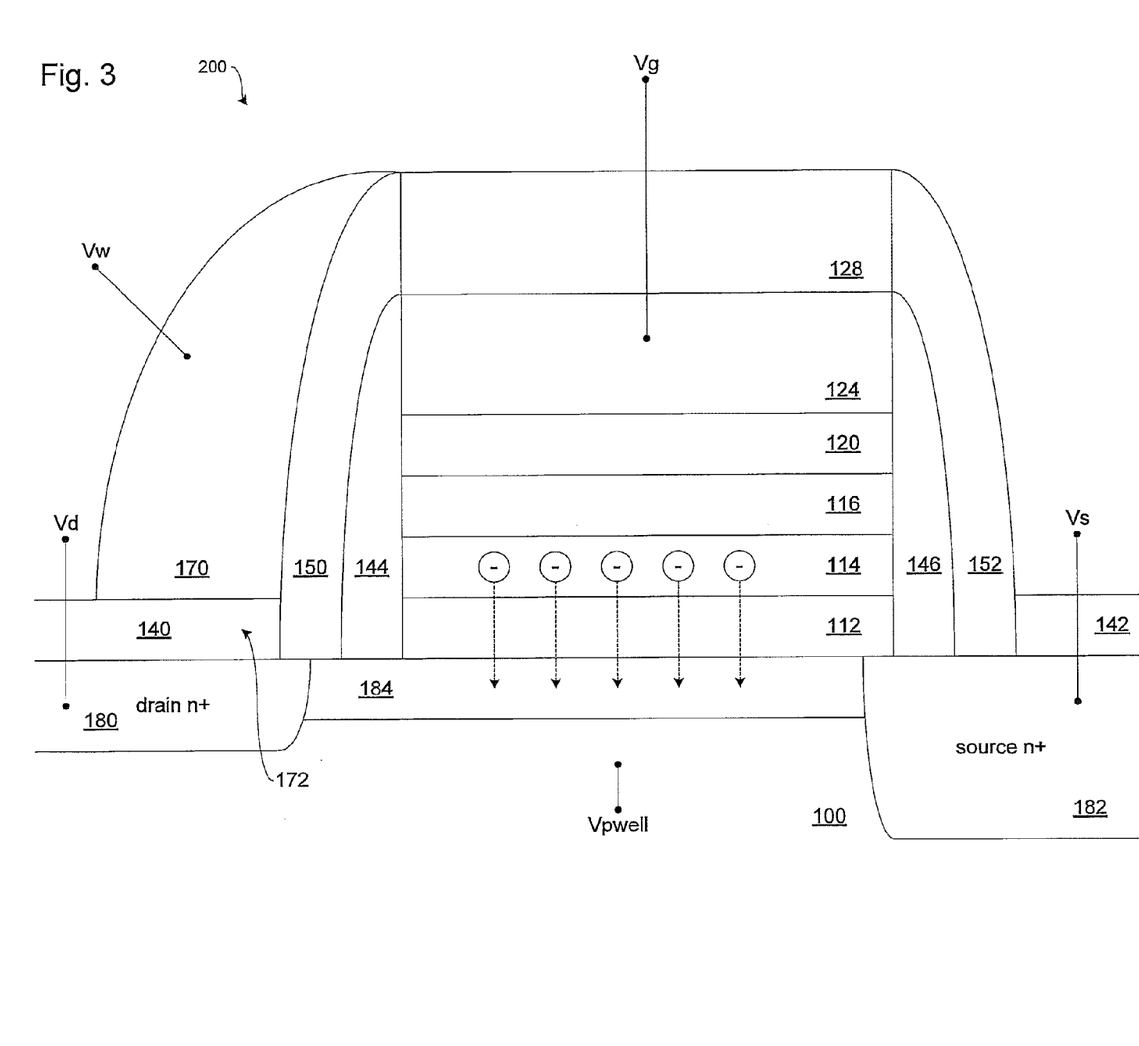
FIG. 3 shows one embodiment of an erase operation for the non-volatile memory device formed from the process of FIGS. 1A-1L.

FIG. 3 shows one embodiment of an erase operation for memory cell 200 formed from the process of FIGS. 1A-1L. In one aspect, the erase operation shown in FIG. 3 may be referred to as channel direct tunneling of holes from channel region 184 to nitride layer 114. As described herein, a negative bias is applied to gate region 124 (e.g., Vg of approx. −3V) and a positive bias is applied to Vpwell region of substrate 100 (e.g., Vpwell of approx. +7V) to inject holes into nitride layer 114 from channel region 184 of substrate 100. In one embodiment, the nitride layer 114 functions as a charge storage layer for storing or trapping positive charges.

The following table describes one embodiment of the approximate node voltages for erasing memory cell 200 of FIG. 3:

| Erase Voltage Table | | |
|---|---|---|
| | Range | Approx. |
| Vg | −3 to −4 V | −3 V |
| Vd | Float | Float |
| Vs | Float | Float |
| Vw | Float | Float |
| Vpwell | +7 to +8 V | +7 V |

In one implementation, to program memory cell 200 using channel hot electron injection, a voltage difference is created between source/drain regions 182, 180, and gate region 124 is driven to a positive voltage relative to channel region 184 for inversion of the channel region 184 from type P to type N. As such, current flows between source/drain regions 182, 180 through channel region 184 to inject hot electrons from channel region 184 of substrate 100 to charge storage region (i.e., nitride layer 114). The hot electrons pass through tunneling dielectric region (i.e., first oxide layer 112) to the charge storage region. As previously discussed, these hot injected electrons become trapped in the charge storage region (i.e., nitride layer 114). In another implementation, memory cell 200 may be erased by driving the gate region 124 to a negative voltage relative to channel region 128 and/or one or both of source/drain regions 182, 180.

Embodiments described herein illustrate but do not limit the disclosure. It should be understood that numerous modifications and variations are possible in accordance with the principles of the disclosure. Accordingly, the scope and spirit of the disclosure should be defined by the following claims.

We claim:

1. A device for non-volatile memory, the device comprising:
   a cell stack comprising:
      a tunneling dielectric layer formed on a channel region of a substrate,
      a charge storage layer formed on the tunneling dielectric layer, the charge storage layer comprising silicon-nitride,
      a blocking dielectric layer formed on the charge storage layer, and
      a control gate formed on the blocking dielectric layer;

a select gate formed adjacent to a first sidewall of the cell stack, the cell stack having two sidewalls that include end portions of the tunneling dielectric layer, the charge storage layer, the blocking dielectric layer, and the control gate, the select gate only overlying the first sidewall of the two sidewalls of the cell stack;

a first oxide region formed adjacent to a full length of the first sidewall of the cell stack;

a second oxide region formed adjacent to a full length of a second sidewall of the cell stack;

a first spacer formed between the first oxide region and the select gate;

a second spacer formed adjacent to the second oxide region; and a drain region and a source region formed in the substrate, wherein the drain region is formed adjacent to the select gate, and wherein the source region is formed adjacent to the cell stack opposite the drain region, and wherein the channel region is formed between the drain and the source regions, wherein, when a selected bias of a first polarity is applied to the control gate and the select gate relative to the channel region of the substrate, charges of an opposite polarity are injected from the channel region of the substrate through the tunneling dielectric layer and into the charge storage layer to thereby store the opposite polarity charges in the charge storage layer, and wherein, when a selected bias of a second polarity opposite to the first polarity is applied to the control gate relative to the channel region of the substrate, charges of the first polarity are directly tunneled from the channel region of the substrate through the tunneling dielectric layer and into the charge storage layer to thereby store the first polarity charges in the charge storage layer.

2. The device of claim 1, wherein the substrate comprises a P-type mono-crystalline silicon (Si) substrate.

3. The device of claim 1, wherein the tunneling dielectric layer comprises silicon-dioxide (SiO2) having a thickness of approximately 15-25 A.

4. The device of claim 1, wherein the tunneling dielectric layer comprises silicon-dioxide (SiO2) having a thickness of approximately 21 A.

5. The device of claim 1, wherein the charge storage region comprises silicon-nitride (Si3N4) having a thickness of approximately 50-70 A.

6. The device of claim 1, wherein the charge storage region comprises silicon-nitride (Si3N4) having a thickness of approximately 60 A.

7. The device of claim 1, wherein the blocking dielectric layer comprises silicon-dioxide (SiO2) having a thickness of approximately 70-90 A.

8. The device of claim 1, wherein the blocking dielectric layer comprises silicon-dioxide (SiO2) having a thickness of approximately 80 A.

9. The device of claim 1, wherein the control gate comprises a first gate layer positioned adjacent to the blocking dielectric layer, and wherein the first gate layer comprises at least one of poly-silicon (poly-Si), doped poly-Si, phosphorous (P), tungsten (W) and tantalum (Ta).

10. The device of claim 9, wherein the control gate comprises a second gate layer positioned adjacent to the first gate layer, and wherein the second gate layer comprises at least one of tungsten-silicide (WSi2) and poly-silicon (poly-Si).

11. The device of claim 1, further comprising a protection layer formed on the control gate, wherein the protection layer comprises silicon-nitride (SiN).

12. The device of claim 1, wherein the tunneling dielectric layer, charge storage layer, blocking dielectric layer and control gate form a memory cell on the substrate.

13. The device of claim 1, wherein the first and second spacers comprise silicon-nitride (SiN).

14. The device of claim 1, wherein the select gate comprises poly-silicon (poly-Si).

15. The device of claim 1, further comprising a select gate oxide formed between the select gate and the substrate.

16. The device of claim 15, wherein the select gate oxide comprises silicon-dioxide (SiO$_2$) having a thickness of approximately 80-200 A.

17. The device of claim 15, wherein the select gate oxide comprises silicon-dioxide (SiO$_2$) having a thickness of approximately 120 A.

18. A method for manufacturing a non-volatile memory device, the method comprising:

forming a tunneling dielectric layer on a channel region of a substrate;

forming a charge storage layer on the tunneling dielectric layer, the charge storage layer comprising silicon-nitride;

forming a blocking dielectric layer on the charge storage layer;

forming a control gate on the blocking dielectric layer;

forming a first oxide region adjacent to a full length of a first sidewall of a cell stack defined by end portions of the tunneling dielectric layer, the charge storage layer, the blocking dielectric layer, and the control gate, the cell stack having two sidewalls;

forming a second oxide region adjacent to a full length of a second sidewall of the cell stack;

forming a first spacer adjacent to the first oxide region;

forming a second spacer adjacent to the second oxide region;

forming a select gate adjacent to the first spacer, the select gate only overlying the first sidewall of the two sidewalls of the cell stack; and forming a drain region and a source region in the substrate, wherein the drain region is formed adjacent to the select gate, and wherein the source region is formed adjacent to the cell stack opposite the drain region, and wherein the channel region is formed between the drain and the source regions, wherein applying a selected bias of a first polarity to the control gate and the select gate relative to the channel region of the substrate stores charges of an opposite polarity in the charge storage layer, and wherein applying a selected bias of a second polarity opposite to the first polarity to the control gate relative to the channel region of the substrate stores first polarity charges in the charge storage layer.

19. The method of claim 18, wherein applying a selected bias of a first polarity to the control gate and the select gate relative to the channel region of the substrate causes charges of an opposite polarity to be injected from the channel region of the substrate through the tunneling dielectric layer and into the charge storage layer for storage of the opposite polarity charges in the charge storage layer.

20. The method of claim 18, wherein applying a selected bias of a second polarity opposite to the first polarity to the control gate relative to the channel region of the substrate causes charges of the first polarity to be tunneled from the channel region of the substrate through the tunneling dielectric layer and into the charge storage layer for storage of the first polarity charges in the charge storage layer.

* * * * *